United States Patent [19]

Bergsjö et al.

[11] Patent Number: 4,961,066
[45] Date of Patent: Oct. 2, 1990

[54] FAULT CURRENT LIMITER

[75] Inventors: Nils-Johan Bergsjö; Lars Liljestrand, both of Västerås, Sweden

[73] Assignee: Asea Brown Boveri AB, Västerås, Sweden

[21] Appl. No.: 362,667

[22] Filed: Jun. 7, 1989

[30] Foreign Application Priority Data

Jun. 10, 1988 [SE] Sweden ............................ 8802172

[51] Int. Cl.⁵ .......................................... H01L 43/00
[52] U.S. Cl. .................................. 338/32 S; 338/334; 361/19
[58] Field of Search ...................... 338/32 S, 334, 204, 338/205; 361/19, 141; 505/881

[56] References Cited

U.S. PATENT DOCUMENTS

| | | | |
|---|---|---|---|
| 4,438,474 | 3/1984 | Palce | 361/58 |
| 4,470,090 | 9/1984 | Carr, Jr. | 361/19 |
| 4,490,769 | 12/1984 | Boenig | 361/19 X |
| 4,568,907 | 2/1986 | Hurtle | 338/61 |
| 4,700,257 | 10/1987 | Bekhaled | 361/19 |

FOREIGN PATENT DOCUMENTS 2712990  3/1977  Fed. Rep. of Germany .

OTHER PUBLICATIONS

Journal of Applied Physics; 49(4); Apr. 1978; pp. 2546–2550; K. E. Gray and D. Fowler; "A Superconductive Fault-Air-Rent Limiter".

Primary Examiner—Bruce A. Reynolds
Assistant Examiner—Marvin M. Lateef
Attorney, Agent, or Firm—Watson, Cole, Grindle & Watson

[57] ABSTRACT

A current limiter according to the invention has two resistors, the first one consisting of a thin layer of a material which may become superconducting and the second one is a resistance layer applied on first resistor, the latter resistor layer being dimensioned such that its resistance becomes considerably lower than the resistance of the superconducting layer when it is not superconducting, however with a resistance of such a magnitude that, in the current circuit in question, it limits the current to a permissible value. For mechanical support of the resistors, an insulator is included in the current limiter, and the superconducting material is applied on insulator. The resistors and the insulator are arranged immersed into a cryotank.

7 Claims, 1 Drawing Sheet

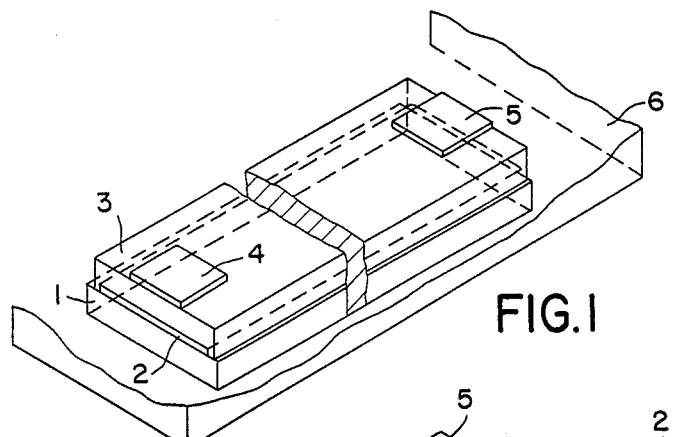
FIG.1
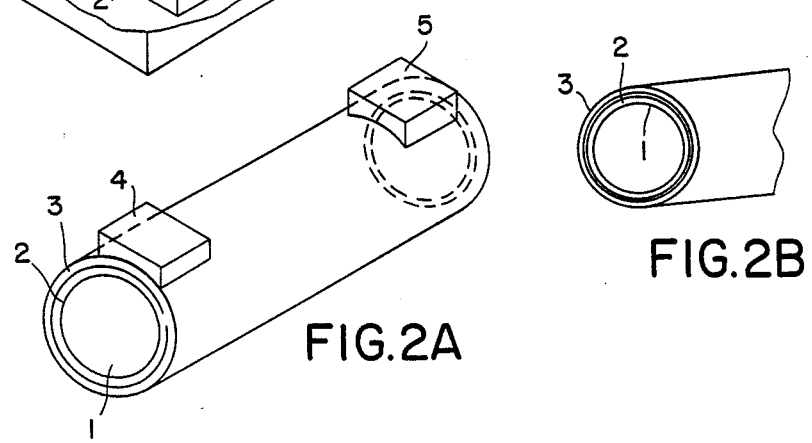
FIG.2A
FIG.2B
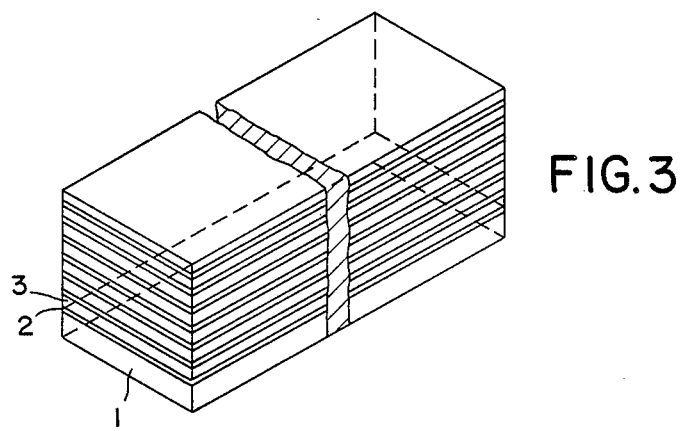
FIG.3
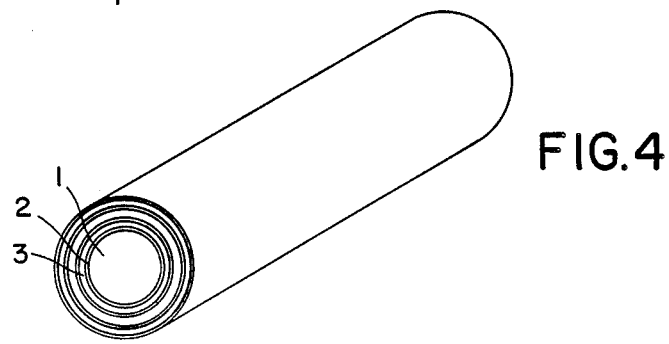
FIG.4

FAULT CURRENT LIMITER

BACKGROUND OF THE INVENTION

1. Technical Field

Short circuits on power networks may cause great damage. It is therefore desirable to be able rapidly to limit both the amplitude and duration of the short circuit currents which may occur. The sensing means and circuit-breakers which are available at present have a time delay corresponding to a few cycles before the current can be broken. Because of the generally relatively large mechanical masses that are to be activated when a line circuit-breaker is to open, it is difficult to attain shorter break times. A generally known way of rapidly reducing a short circuit current is to connect a current limiting element in series with a circuit breaker. Different such current limiting elements are available. The invention comprises a fault current limiter which is based on the use of superconductors and a current limiting resistor.

2. Background Art, the Problem

A superconducting material is dependent on three parameters to achieve or maintain its superconducting state. If any of these parameters exceeds a critical value, the superconducting state ceases and the material resumes its normal conducting state. The three parameters are temperature, current density and magnetic flux density. All these parameters have been used to achieve the desired current limitation. An example of how to use several of the critical parameters in combination in order to produce a current limiter is described in an article in Journal of Applied Physics, 49 (4), April 1978, pages 2546-2550 by K. E. Gray and D. Fowler entitled "A superconducting fault-current limiter". This current limiter comprises two parallel-connected resistors. One resistor consists of a material which may become superconducting and which is located in a cryostat, i.e. a cryotank, in which the low temperature which is necessary to obtain a superconducting state can be attained, while at the same time the resistor is dimensioned such that the current at which the current limiter is to enter into operation gives a current density which is well below the critical density and such that the normally surrounding magnetic flux density is also lower than the critical density In the embodiment described in the above-mentioned article, the resistance is changed from practically zero at a superconducting state to the order of magnitude of 13 k$\Omega$ when the superconducting state ceases The second resistor is dimensioned such that its resistance is considerably lower than the resistance of the superconducting resistor when this is no longer superconducting; in the case referred to the resistance is about 3.6$\Omega$.

Under normal circumstances of the network, the superconducting resistor is kept in a superconducting state, i.e. its resistance is zero whereby current only flows through this resistor and no voltage drop occurs across the two parallel-connected resistors. Now, if the mains current because of a short-circuit or otherwise exceeds a permissible value corresponding the value at which it is desired that the current limiter should start operating, the superconducting resistor in the described device is changed by a magnetic field partially changing the magnetic flux density around the conductor, thus obtaining a partial increase of the resistance which also results in an increase of the temperature in the resistor Before long this will lead to the superconducting state being terminated and a predominant part of the current having to pass through the parallel-connected resistor Only using the critical current density to cause a superconducting material to pass from superconducting to non-superconducting state is described in DE-OS No. 2 712 990 entitled "Anordnung zur Ueberstrombegrenzung in elektrischen Energieversorgungsstrecken". This patent specification describes a current limiter in the form of a "superconducting cable" consisting of conductors of a material that may become superconducting and of conductors ("Matrix-/Trägermetall") dimensioned such that the superconducting cable constitutes a current-limiting element when the parallel-connected superconducting conductor is no longer superconducting. The superconducting conductor(s) is (are) formed with certain regions having area reductions ("Einschnürungen") whereby the critical current density is exceeded when the current carried through the cable exceeds the current at which the current limiter is to start operating.

The fact that the current limiters based on the two different states of a superconductor have not been used to any significant extent is due to a number of reasons. Up to a few years ago, the critical temperature lay at very low values, which entailed expensive and difficultly-manageable cooling devices, normally using helium as coolant. In part, the low use is also due to the complexity of the equipment involved, for example the equipment described in Journal of Applied Physics.

One problem in connection with the superconducting cable described above, and which is passed over in silence, is what happens to the heat developed in the cable when it changes from superconducting to normally conducting state.

The discovery of new materials which become superconducting at a considerably higher temperature, which, for example, enables the use of liquid nitrogen as coolant, has, of course, also a positive effect on existing technical solutions.

SUMMARY OF THE INVENTION

The discovery of new materials and combinations of materials, for example ceramic materials, which may become superconducting at considerably higher temperatures than previously known materials, has contributed to increase the interest in practical applications of this physical phenomenon. This is also true of current limiters which utilize the transition from superconducting to non-superconducting state to limit an undesirable increase of the current, for example in the line system of a power network upon a short circuit However, the application of the invention has nothing specifically to do with the recent discovery of materials with higher critical temperatures than before However, the invention imposes certain demands, as will be clear from the following, on the workability of the superconducting materials.

In principle, the invention is a variant of the above-described fault current limiter disclosed in Journal of Applied Physics Thus, a fault current limiter according to the invention comprises two parallel-connected resistors, the first one consisting of a material which may become superconducting. In a superconducting state, thus, the second resistor is short. circuited and no voltage drop lies across the combination of resistors. The second resistor has a resistance which is considerably lower than the resistance of the superconducting resistor when this is no longer in a superconducting state However, it should have a resistance which is of such a magnitude that the current in the circuit in question does not grow too large. However, here ends the similarity between the prior art and a current limiter according to the invention.

A fault current limiter according to the invention comprises two resistor layers. A first layer consists of a material that may become superconducting The second layer consists of a layer of a normally conducting material which is applied on the first layer by vapour deposition, plasma spraying, or otherwise. The second layer is dimensioned such that its resistance is considerably lower than the resistance of the superconducting layer when it is not in a superconducting state. However, the second layer is to be dimensioned such that, when the first layer is no longer superconducting, the resistance is to limit the overcurrent to a permissible value.

The connection of the fault current limiter takes place by means of connection devices attached to the second resistor layer Since the combination of resistors will be both thin and brittle, a mechanical base for these two layers is needed. The base may conveniently consist of an insulating material on which the superconducting material is applied This can be done, for example, by sputtering or other technique, which permits the superconducting layer to be evenly distributed on the insulator and which also permits the layer to become sufficiently thin.

In a current limiting device according to the invention, the two resistance layers, the insulator, and the connecting parts are to be situated in a cryostat.

The critical parameter which according to the invention is used to achieve the transition from superconducting to non-superconducting state is the critical current density By the superconducting material being formed as a thin layer, there are no problems in dimensioning the cross-section area of the layer so as to attain a critical current density for the maximum current desired.

A current limiter according to the invention may also consist of current limiting elements with several layers of superconducting materials alternating with resistance material.

The fault current limiter according to the invention can also be formed with series-connected elements with a successively increasing critical current In this way, a smooth transition between superconducting and normally conducting state can be achieved, i.e. in practice a current-dependent current limiter A considerable advantage with a fault current limiter according to the invention is that problems with possible local defects in the superconducting material are eliminated Since the current limiter consists of two separate and different resistors, the superconductor can be destroyed because of the temperature increase which is obtained in case of local defects. With a current limiter according to the invention, in the event of any local defects the current will be able to be carried in the second resistance layer.

Upon a short-circuit on the network, the current limiter will limit the current until the line circuit-breaker opens. During this period, the current limiter will absorb the energy developed, which is due to the amplitude and duration of the current and on the resistance of the second resistor This energy gives rise to a temperature increase, which has to be remedied by the supply of additional coolant.

BRIEF DESCRIPTION OF THE DRAWINGS

FIG. 1 shows a preferred embodiment of a fault current limiter according to the invention.

FIG. 2 shows an alternative embodiment of the invention.

FIG. 3 shows how a current limiter according to the invention can be formed with several layers of alternately superconducting and resistance materials, respectively, and FIGS. 2A and 2B show an additional variant with alternately applied layers.

It is understood that all of the hidden lines are not shown in FIG. 3 for the sake of clarity. Further, the connection means are not shown in FIGS. 3 and 4.

DESCRIPTION OF THE PREFERRED EMBODIMENT

The dimensioning of the parts included in the fault current limiter with respect to the cross-sectional area of the first superconducting material in order to obtain transition at the critical current, the choice of material for the second resistance layer and the cross-sectional area of this layer, the necessary length of the resistors, temperature increases, developed power, the need of coolant, and so on, are, of course, dependent on the properties of the available materials at the time of construction, the currents occurring, etc., and will therefore not be described here. As will have been clear from the foregoing, the invention comprises the design of the fault current limiter. A preferred embodiment is shown in FIG. 1. On a supporting insulator 1 in the form of a rod with rectangular cross-section, there is applied on one side by means of sputtering or the like a thin layer 2 of superconducting material. The shunt resistance 3, consisting of a suitable resistance material, is applied by vapour deposition, plasma spraying, or in some other way, on the superconducting material The other resistance layer is provided with connection means 4 and 5.

A cryotank is shown as element 6.

An alternative embodiment comprises applying a superconducting layer on two opposing sides of the rod, outside of which layers of the second resistance material are applied.

In an alternative according to FIG. 2A, the supporting insulator 1 consists of a cylindrical rod or a tube on which the two resistance layers are applied as shown in FIG. 2B.

The supporting insulator may, of course, otherwise have a number of different embodiments which are covered by the invention.

FIG. 3 shows schematically how several alternating layers of superconducting material and resistance materials are applied one above the other The connection means 4 and 5 are applied in a manner similar to that shown in FIG. 1.

FIG. 4 shows how the technique using alternating layers is carried out on the basis of a cylindrical supporting insulator 1. When dimensioning the different layers, special attention must be paid to the fact that the radius increases for each new layer.

The connection means 4 and 5 are applied in a manner similar to that shown in FIG. 2.

As described above, the current limiter can be designed as a series connection of current-limiting elements with a rising critical current density, whereby a current-dependent current-limiter characteristic can be obtained.

What is claimed is:

1. A fault current limiter comprising a first and a second resistor, the first resistor consisting of a material which may become superconducting, the second resistor consisting of a normally conducting material, an insulator for mechanical support of the resistors, and a cryotank, wherein the first resistor is arranged as a thin layer applied on the insulator and which is dimensioned such that the current limit at which the current limiter is to start operating corresponds to such a current density that the critical current density of the material is achieved, the second resistor is arranged as a layer applied on the first resistor, the second resistor is dimensioned such that its resistance reduces a possible overcurrent to an acceptable value, the second resistor is provided with current connection means, and wherein the insulator and the resistor are placed in the cryotank.

2. A fault current limiter according to claim 1, wherein the insulator is arranged as a rod with rectangular cross-section, the first resistor being applied on one side of said rod and the second resistor being applied on top of said first resistor 3. A fault current limiter according to claim 1, wherein the insulator is arranged as a rod with rectangular cross-section, a first resistor being applied on opposite sides of said rod and a second resistor being applied on top of said first resistors.

4. A fault current limiter according to claim 1, wherein the insulator is arranged as a cylindrical rod, the first resistor being applied on the envelope surface of said rod and the second resistor being applied on top of said first resistor.

5. A fault current limiter according to claim 1, wherein the insulator is arranged as a tube, the first resistor being applied on the envelope surface of said tube and the second resistor being applied on top of said first resistor.

6. A fault current limiter according to claim 1, wherein several layers of first and second resistors are applied alternately one above the other.

7. A fault current limiter comprising a plurality of current limiters according to claim 1 connected in series, wherein the first resistor in all series-connected current limiters has different cross-section areas.

* * * * *